(12) United States Patent
Ueda et al.

(10) Patent No.: US 8,847,381 B2
(45) Date of Patent: Sep. 30, 2014

(54) SEMICONDUCTOR ELEMENT HOUSING PACKAGE AND SEMICONDUCTOR DEVICE EQUIPPED WITH THE SAME

(75) Inventors: Yoshiaki Ueda, Higashiomi (JP); Shinji Nakamoto, Higashiomi (JP); Hiroshi Mizushima, Higashiomi (JP); Nobuyuki Tanaka, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/980,440

(22) PCT Filed: Dec. 19, 2011

(86) PCT No.: PCT/JP2011/079356
§ 371 (c)(1),
(2), (4) Date: Jul. 18, 2013

(87) PCT Pub. No.: WO2012/098799
PCT Pub. Date: Jul. 26, 2012

(65) Prior Publication Data
US 2013/0307135 A1 Nov. 21, 2013

(30) Foreign Application Priority Data
Jan. 20, 2011 (JP) ................. 2011-009534

(51) Int. Cl.
*H01L 23/04* (2006.01)
*H01L 23/00* (2006.01)
*H01L 23/495* (2006.01)
*H01L 23/057* (2006.01)

(52) U.S. Cl.
CPC ...... *H01L 23/562* (2013.01); *H01L 2224/49175* (2013.01); *H01L 2224/48091* (2013.01); *H01L 2224/06181* (2013.01); *H01L 24/49* (2013.01); *H01L 2224/85455* (2013.01); *H01L 2224/48247* (2013.01); *H01L 24/85* (2013.01); *H01L 23/49551* (2013.01); *H01L 23/49562* (2013.01); *H01L 24/48* (2013.01); *H01L 23/057* (2013.01); *H01L 24/06* (2013.01); *H01L 2224/85444* (2013.01)
USPC ............... 257/698; 257/E23.103; 257/678; 257/700; 257/723; 438/121; 438/122

(58) Field of Classification Search
CPC .......... H01L 2924/01079; H01L 2924/01078; H01L 2924/15311
USPC ............... 257/E23.051, E23.103, E23.102, 257/E23.08, 578, 678, 698, 700, 707, 711, 257/719, 723–725, 729, 730, 770; 438/106, 438/121, 122, 123, 685
See application file for complete search history.

(56) References Cited

U.S. PATENT DOCUMENTS 4,506,108 A * 3/1985 Kersch et al. ................. 174/527
5,295,044 A * 3/1994 Araki et al. ................... 361/709

(Continued)

FOREIGN PATENT DOCUMENTS

JP 2000195814 A 7/2000
JP 2000195894 A 7/2000

(Continued)

OTHER PUBLICATIONS

International Search Report, PCT/JP2011/079356, Mar. 5, 2012, 1 pp.

*Primary Examiner* — Chris Chu
(74) *Attorney, Agent, or Firm* — Volpe and Koenig, P.C.

(57) ABSTRACT

A semiconductor element housing package includes a substrate, a frame body disposed on the substrate; an insulating substrate disposed in a frame-body-surrounded region of the substrate; a first mounting member disposed on the insulating substrate, for mounting a power semiconductor element thereon; a second mounting member disposed on the insulating substrate so as to be spaced away from the first mounting member; a first lead member having a first bend; and a second lead member having a second bend. The first lead member is disposed so as to pass through the frame body from an exterior thereof and extend over the first mounting member and makes connection therewith through the first bend. The second lead member is disposed so as to pass through the frame body from the exterior thereof and extend over the second mounting member and makes connection therewith through the second bend.

12 Claims, 7 Drawing Sheets

(56) References Cited

U.S. PATENT DOCUMENTS

| | | | |
|---|---|---|---|
| 5,365,108 A * | 11/1994 | Anderson et al. | 257/678 |
| 5,616,886 A * | 4/1997 | Romero et al. | 174/542 |
| 5,901,042 A * | 5/1999 | Ota et al. | 361/704 |
| 6,473,291 B1 * | 10/2002 | Stevenson | 361/306.3 |
| 6,479,327 B2 * | 11/2002 | Takahashi et al. | 438/124 |
| 6,583,505 B2 * | 6/2003 | Choi | 257/730 |
| 6,703,703 B2 * | 3/2004 | Grant | 257/688 |
| 6,758,607 B2 * | 7/2004 | Nakabayashi et al. | 385/88 |
| 6,860,649 B2 * | 3/2005 | Edwards et al. | 385/92 |
| 7,671,467 B2 * | 3/2010 | Nonaka et al. | 257/711 |
| 7,989,951 B2 * | 8/2011 | Yeung et al. | 257/732 |
| 2005/0191793 A1 * | 9/2005 | Brennan et al. | 438/125 |
| 2010/0200932 A1 | 8/2010 | Ueda | |

FOREIGN PATENT DOCUMENTS

| | | |
|---|---|---|
| JP | 2003249584 A | 9/2003 |
| WO | 2008146531 A1 | 12/2008 |

* cited by examiner (a)

(b)

(a)

(b)

(c)

(a)

(b)

(c)

US 8,847,381 B2

SEMICONDUCTOR ELEMENT HOUSING PACKAGE AND SEMICONDUCTOR DEVICE EQUIPPED WITH THE SAME

FIELD OF INVENTION

The present invention relates to a semiconductor element housing package for installation of a power semiconductor element, and a semiconductor device on which a power semiconductor element in the semiconductor element housing package is mounted.

BACKGROUND

By way of the related art, there is a construction in which a semiconductor element is mounted on a lead member, and the lead member is drawn out of the construction. An example of techniques to draw the lead member to the outside is disclosed in Japanese Unexamined Patent Publication JP-A 2000-195894.

By way of future art, power semiconductor elements are currently under development. In keeping with it, the development of packages suitable for use with the power semiconductor elements has been pursued.

An object of the invention is to provide a semiconductor element housing package capable of suppressing occurrence of cracks and fracture due to generation of heat from a power semiconductor element, and also a semiconductor device equipped with the semiconductor element housing package.

SUMMARY

A semiconductor element housing package in accordance with one embodiment of the invention includes a substrate, a frame body disposed on the substrate, and an insulating substrate disposed in a region of the substrate, the region being surrounded with the frame body. Moreover, the semiconductor element housing package includes a first mounting member disposed on the insulating substrate, for mounting a power semiconductor element thereon, and a second mounting member disposed on the insulating substrate so as to be spaced away from the first mounting member. Further, the semiconductor element housing package includes a first lead member having a first bend and a second lead member having a second bend. The first lead member is disposed so as to pass through the frame body from an exterior thereof, and extend over the first mounting member so as to make connection therewith through the first bend. Also, the second lead member is disposed so as to pass through the frame body from the exterior thereof, and extend over the second mounting member so as to make connection therewith through the second bend.

A semiconductor device in accordance with one embodiment of the invention includes the semiconductor element housing package, a power semiconductor element disposed on the first mounting member and electrically connected to the second mounting member via wire, and a lid body disposed on the frame body so as to cover the power semiconductor element.

A semiconductor element housing package in accordance with one embodiment of the invention includes a substrate made of a metal material, a ceramic frame body disposed on the substrate, and an insulating substrate made of a ceramic material, disposed in a region of the substrate, the region being surrounded with the ceramic frame body. Moreover, the semiconductor element housing package includes a first mounting member disposed on the insulating substrate, for mounting a power semiconductor element thereon, and a second mounting member disposed on the insulating substrate so as to be spaced away from the first mounting member. Further, the power semiconductor element housing package includes a first lead member disposed so as to pass through the ceramic frame body from an exterior thereof and extend over the first mounting member, and a second lead member disposed so as to pass through the ceramic frame body from the exterior thereof and extend over the second mounting member.

BRIEF DESCRIPTION OF THE DRAWINGS

FIG. 1 is views showing a semiconductor element housing package in accordance with one embodiment of the invention, wherein FIG. 1(a) is a perspective view of the semiconductor element housing package, and FIG. 1(b) is a sectional view of the semiconductor element housing package shown in FIG. 1(a) taken along the line X-X, with a power semiconductor element and a lid body provided therein;

FIG. 5 is views showing the semiconductor element housing package shown in FIG. 3, wherein FIG. 5(a) is a sectional view of the semiconductor element housing package shown in FIG. 3 taken along the line Y-Y, FIG. 5(b) is a sectional view of a first mounting member, and FIG. 5(c) is a plan view showing the relationship between the first mounting member and a first lead member;

FIG. 6 is views showing the semiconductor element housing package shown in FIG. 3, wherein FIG. 6(a) is a sectional view of the semiconductor element housing package shown in FIG. 3 taken along the line Z-Z, FIG. 6(b) is a sectional view of a second mounting member, and FIG. 6(c) is a plan view showing the relationship between the second mounting member and a second lead member;

DETAILED DESCRIPTION OF THE PREFERRED EMBODIMENTS

Figure 1:
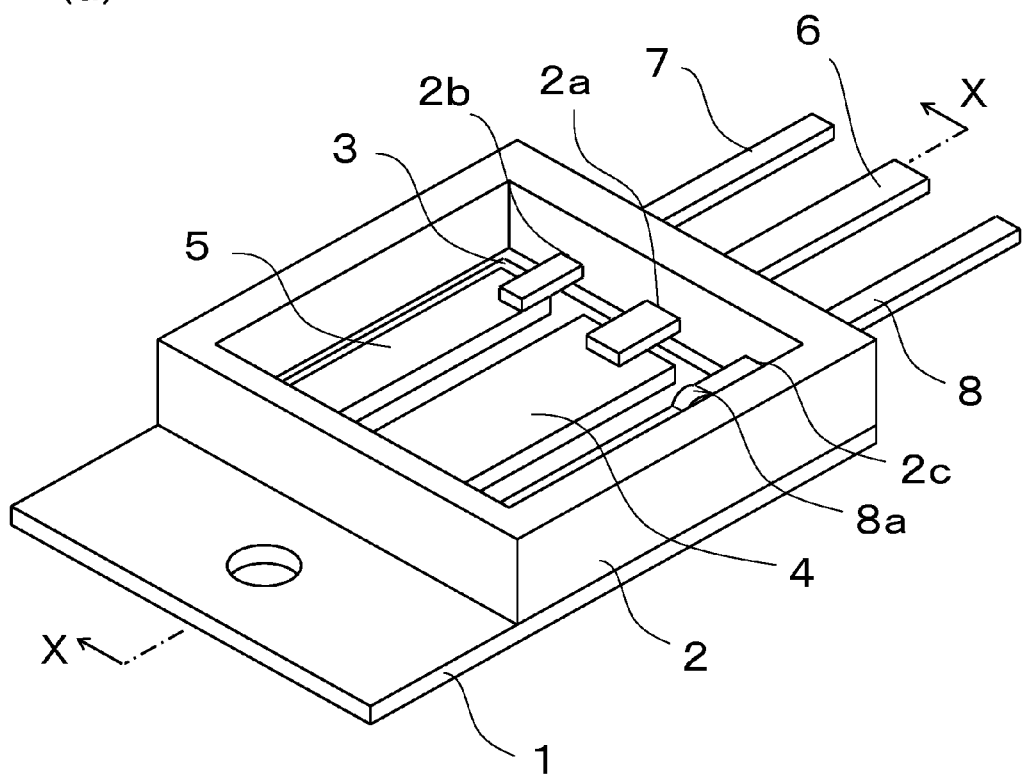
Figure 1:
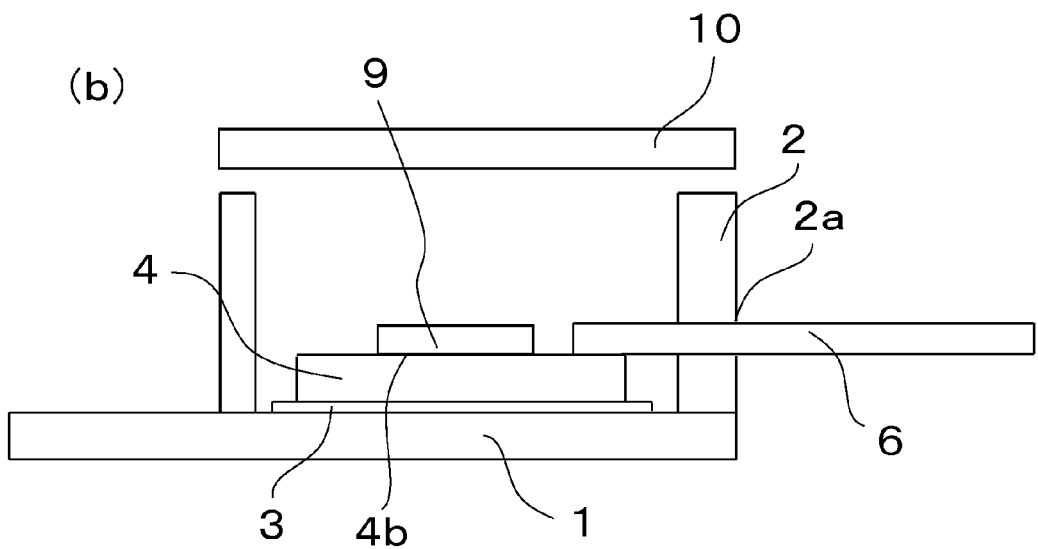
Figure 2:
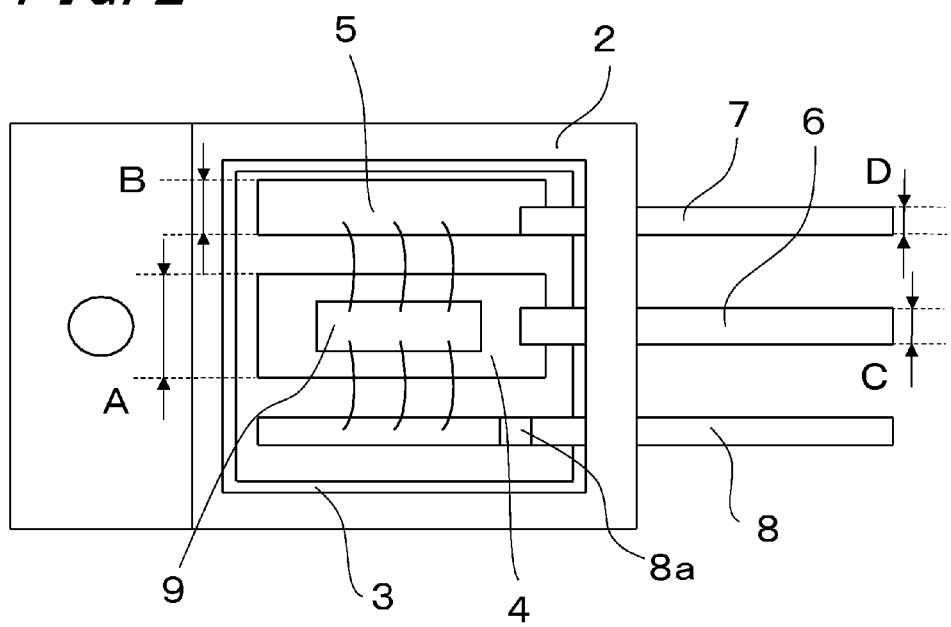
FIG. 2 is a plan view showing the semiconductor element housing package shown in FIG. 1, with a semiconductor element provided therein.

Hereinafter, a semiconductor element housing package and a semiconductor device in accordance with one embodiment of the invention will be described with reference to drawings.

Embodiment

Structure of Semiconductor Element Housing Package and Structure of Semiconductor Device A semiconductor element housing package in accordance with one embodiment of the invention includes: a substrate 1;

a first mounting member 4 disposed on the substrate 1 and having a mounting portion 4b for mounting a power semiconductor element 9 thereon; and a second mounting member 5 disposed on the substrate 1 so as to be spaced away from the first mounting member 4. Moreover, the semiconductor element housing package includes a frame body 2 disposed on the substrate 1 so as to surround the first mounting member 4 and the second mounting member 5 and having a first penetration portion 2a and a second penetration portion 2b. Furthermore, the semiconductor element housing package includes a first lead member 6 disposed so as to pass through the first penetration portion 2a and a second lead member 7 disposed so as to pass through the second penetration portion 2b.

Moreover, a semiconductor device includes: the semiconductor element housing package; the power semiconductor element 9 mounted on the mounting portion 4b of the first mounting member 4 and electrically connected to the second mounting member 5; and a lid body 10 disposed on the upper surface of the frame body 2.

The substrate 1 is a plate-like member which is given a rectangular planar shape, and has an extension located externally of the frame body 2. Moreover, the extension is formed with a screw mounting portion defined by a through hole.

The screw mounting portion is intended to secure the semiconductor element housing package and an external board to each other by using a screw or the like. Examples of the external board include a heatsink board and a printed circuit board. Moreover, although one screw mounting portion is provided in the extension, the number of the screw mounting portion is not limited to one, and therefore a plurality of screw mounting portions may be provided in the extension. Furthermore, the through hole defining the screw mounting portion may be given any shape without limitation so long as the screw mounting portion becomes capable of attachment of the substrate 1 to the external board.

Moreover, the substrate 1 is made of a metal material such for example as copper, an iron-nickel-cobalt alloy, or a copper-tungsten alloy. The substrate 1 is made of a material which swiftly dissipates heat liberated by the power semiconductor element 9. The substrate 1 may also be made of a ceramic material such for example as alumina ceramics, aluminum nitride ceramics, or mullite ceramics.

Moreover, the thermal conductivity of the substrate 1 is adjusted to fall in the range of 10 (W/m•K) or more and 500 (W/m•K) or less, for example. Furthermore, the thermal expansion coefficient of the substrate 1 is adjusted to fall in the range of 5 (ppm/° C.) or more and 20 (ppm/° C.) or less, for example. Where the substrate 1 is made of a metal material, for example, it can be produced by shaping an ingot into a predetermined form by means of known metal working such as rolling, punching, or etching. On the other hand, where the substrate 1 is made of a ceramic material, for example, it can be produced by subjecting a plurality of flat green sheets to punching using a die, then laminating the green sheets on top of each other, and firing the laminated body.

Moreover, the substrate 1 is rectangular-shaped. For example, the substrate 1 is so configured that the width of one side falls in the range of 15 (mm) or more and 25 (mm) or less, the width of the other side falls in the range of 25 (mm) or more and 35 (mm) or less, and the thickness falls in the range of 0.5 (mm) or more and 2 (mm) or less.

Furthermore, the substrate 1 has its outer surface clad with a metal which is excellent in corrosion resistance and exhibits good wettability to a bonding material. More specifically, it is advisable to laminate a nickel plating layer and a gold plating layer one after another on the substrate 1 by plating. The plating thickness of the nickel plating layer falls in the range of 0.5 (μm) or more and 9 (μm) or less, for example. Moreover, the plating thickness of the gold plating layer falls in the range of 0.5 (μm) or more and 5 (μm) or less, for example. These metallic plating layers are capable of suppressing oxidative corrosion of the substrate 1 effectively.

In addition, where the substrate 1 is made of a metal material, the first mounting member 4 and the second mounting member 5 are disposed, through an insulating substrate 3, on the upper main surface of the substrate 1. Also, a third lead member 8 is disposed, through the insulating substrate 3, on the upper main surface of the substrate 1. The insulating substrate 3 is made of a ceramic material such for example as alumina ceramics or aluminum nitride ceramics.

The frame body 2 is disposed on the upper main surface of the substrate 1 so as to surround the first mounting member 4 and the second mounting member 5. Moreover, the frame body 2 has the first penetration portion 2a and the second penetration portion 2b formed so as to pass through the side wall of the frame body 2. In the first penetration portion 2a is fitted the first lead member 6, and in the second penetration portion 2b is fitted the second lead member 7. The frame body 2 is disposed on the substrate 1, with a bonding material interposed between them. The bonding material is a brazing filler metal, such for example as a brazing silver-copper alloy or silver solder.

The frame body 2 is made of a ceramic material such for example as alumina ceramics, aluminum nitride ceramics, or mullite ceramics. Moreover, the thermal conductivity of the frame body 2 is adjusted to fall in the range of 10 (W/m•K) or more and 500 (W/m•K) or less, for example. Furthermore, the thermal expansion coefficient of the frame body 2 is adjusted to fall in the range of 5 (ppm/° C.) or more and 20 (ppm/° C.) or less, for example.

Moreover, the frame body 2 may be given the shape of a container having a recess. This container-shaped frame body 1 can be bonded to the upper main surface of the substrate 1. With such a configuration, the first mounting member 4 and the second mounting member 5 can be placed on the bottom of the recess, and, in this case, there is no need to provide the insulating substrate 3; nevertheless it is possible to achieve the same effect as achieved in the case of providing the insulating substrate 3.

The first mounting member 4 is disposed on the upper main surface of the substrate 1, and has the mounting portion 4b on the power semiconductor element 9 is mounted. The second mounting member 5 is disposed on the substrate 1 so as to be spaced away from the first mounting member 4. The second mounting member 5 is electrically connected to the power semiconductor element 9 by means of bonding wire or otherwise. The first mounting member 4 and the second mounting member 5 are made of a metal material such for example as copper, an iron-nickel-cobalt alloy, or a copper-tungsten alloy.

Moreover, the first mounting member 4 and the second mounting member 5 are configured to be a rectangular plate-like body and each have its outer surface clad with a metal which is excellent in corrosion resistance and exhibits good wettability to a bonding material. The surfaces of the first mounting member 4 and the second mounting member 5 are made of an electrically conducting material. More specifically, it is advisable to laminate a nickel plating layer and a gold plating layer one after another on the first mounting member 4 and on the second mounting member 5 by plating. The plating thickness of the nickel plating layer falls in the range of 0.5 (μm) or more and 9 (μm) or less, for example. Moreover, the plating thickness of the gold plating layer falls in the range of 0.5 (μm) or more and 5 (μm) or less, for example. These metallic plating layers are capable of suppressing oxidative corrosion of the first mounting member 4 and the second mounting member 5 effectively.

Furthermore, the first mounting member 4 and the second mounting member 5 should preferably be made of a material which is closely similar in thermal expansion coefficient to the insulating substrate 3, for example, a copper-tungsten composite. In the case of bonding the thereby made first mounting member 4 and second mounting member 5 onto the insulating substrate 3, it is possible to reduce thermal stress applied to the insulating substrate 3, and thereby suppress occurrence of cracks, separation, and breakage in the insulating substrate 3.

The first lead member 6 is an elongated member disposed so as to pass through the first penetration portion 2a. The first lead member 6 has its one end electrically connected, via a bonding material, to the first mounting member 4 within the inside of the frame body 2. The other end of the first lead member 6 extends outward beyond the frame body 2. Moreover, the second lead member 7 is an elongated member disposed so as to pass through the second penetration portion 2b. The second lead member 7 has its one end electrically connected, via a bonding material, to the second mounting member 5 within the inside of the frame body 2. The other end of the second lead member 7 extends outward beyond the frame body 2.

The first lead member 6 extends in the longitudinal direction of the first mounting member 4. Moreover, the second lead member 7 extends in the longitudinal direction of the second mounting member 5. By arranging the first lead member 6 and the second lead member 7 along the longitudinal direction of the first mounting member 4 and the longitudinal direction of the second mounting member 5, respectively, it is possible to transfer heat from the interior of the frame body 2 to the exterior thereof in an efficient manner, and thereby improve the heat-dissipation capability of the semiconductor element housing package.

Electrical connection is established between the first lead member 6 and the first mounting member 4, and also electrical connection is established between the second lead member 7 and the second mounting member 5. Note that the bonding material is an electrically conducting bonding material made of, for example, a brazing filler metal such as silver solder or a brazing silver-copper alloy, low-melting-point solder, or electroconductive epoxy resin. Moreover, for example, the first lead member 6 and the second lead member 7 are so configured that the length falls in the range of 10 (mm) or more and 25 (mm) or less, and the thickness falls in the range of 0.5 (mm) or more and 1 (mm) or less.

Moreover, the first mounting member 4 is made larger in width than the first lead member 6, and also the second mounting member 5 is made larger in width than the second lead member 7. In this way, where the first mounting member 4 is larger in width than the first lead member 6, and the second mounting member 5 is larger in width than the second lead member 7, even when a large-current signal (for example, 50 amperes of current) is transmitted between the first mounting member 4 and the first lead member 6, as well as between the second mounting member 5 and the second lead member 7, the large-current signal propagates smoothly through the first mounting member 4 and the second mounting member 5, wherefore heat generation ascribable to electrical resistance can be suppressed. This helps suppress thermal expansion of the semiconductor element housing package.

Furthermore, the first lead member 6 is made smaller in width than the first mounting member 4, and also the second lead member 7 is made smaller in width than the second mounting member 5. Thus, a region where the first lead member 6, as well as the second lead member 7, is connectably inserted into the frame body 2 can be narrowed. In this way, the junction between the frame body 2 and the first lead member 6, as well as the junction between the frame body 2 and the second lead member 7, namely the area of connection between the ceramic-made frame body 2 and the metal-made first, second lead member 6, 7, can be reduced. Accordingly, the semiconductor element housing package is capable of suppressing stress that acts on the frame body 2 due to the difference in thermal expansion from the first and second lead members 6 and 7. In consequence, occurrence of cracks in the frame body 2 can be suppressed, and the semiconductor element housing package can be provided with an enclosed interior space with enhanced hermeticity. Moreover, heat emanating from the first mounting member 4 is less likely to be transmitted to the first lead member 6 at the junction with the first lead member 6, wherefore heat-induced thermal expansion of the first lead member 6 can be suppressed. Thus, in the semiconductor element housing package, occurrence of cracks and separation at the junction between the frame body 2 and the first lead member can be suppressed.

The longitudinal direction of the first mounting member 4 and the longitudinal direction of the second mounting member 5 coincide with each other. Moreover, in a direction perpendicular to the longitudinal directions of the first mounting member 4 and the second mounting member 5 when seen in a plan view, the width of the first mounting member 4 is greater than the width of the second mounting member 5. By making the first mounting member 4 larger in width than the second mounting member 5, it is possible to transmit heat liberated by the power semiconductor element 9 mounted on the first mounting member 4 to the first mounting member 4 with high efficiency. In addition, since the first mounting member 4 is increased in size, it is less likely that the location for the mounting of the power semiconductor element 9 will undergo thermal deformation.

The width A of the first mounting member 4 is adjusted to fall in the range of 4 (mm) or more and 7 (mm) or less, for example; the width B of the second mounting member 5 is adjusted to fall in the range of 2 (mm) or more and 4 (mm) or less, for example; the width C of the first lead member 6 is adjusted to fall in the range of 1 (mm) or more and 3 (mm) or less, for example; and the width D of the second lead member 7 is adjusted to fall in the range of 1 (mm) or more and 3 (mm) or less, for example.

The third lead member 8 is an elongated member disposed so as to pass through a third penetration portion 2c. The third lead member 8 has its one end bonded, via a bonding material, to the insulating substrate 3 disposed on the upper main surface of the substrate 1 within the inside of the frame body 2. The other end of the third lead member 8 extends, through the third penetration portion 2c, outward beyond the frame body 2. That is, the third lead member 8 has its one end electrically connected to the power semiconductor element 9 thereby to serve as a mounting member, and more specifically this one end is electrically connected to the power semiconductor element 9 by means of bonding wire or otherwise.

In the case where the substrate 1 is made of a ceramic material, the third lead member 8 is bonded at its one end to the upper main surface of the substrate 1 via a bonding material within the inside of the frame body 2. Moreover, the first penetration portion 2a, the second penetration portion 2b, and the third penetration portion 2c are formed in the wide wall of the frame body 2 so as to be flush with one another. The third lead member 8 has a third bend 8a in a part thereof which lies within the inside of the frame body 2, for the sake of adjustment of its height relative to the height of the insulating substrate 3 or the substrate 1. The third bend 8a is a bent part for accommodating thermal stress.

Moreover, by virtue of the third bend 8a provided in the third lead member 8, even though that part of the third lead member 8 which lies between the junction with the side wall of the frame body 2 and the junction with the insulating substrate 3 expands and contracts due to thermal expansion, the third lead member 8 can be deformed readily at the third bend 8a, with the consequence that the third lead member 8 is less prone to being bent into distortion, for example. Note that the third bend 8a may take various shapes, including a curvilinear profile and a rectangular profile. In addition, the third bend 8a of the third lead member 8 is created by means of press-working or otherwise at the time of formation of the third lead member 8.

For example, the third lead member 8 is so configured that the width falls in the range of 1 (mm) or more and 3 (mm) or less, the length falls in the range of 22 (mm) or more and 37 (mm) or less, and the thickness falls in the range of 0.5 (mm) or more and 1 (mm) or less. Note that the third lead member 8 has the same width at both of the part lying within the frame body 2 and the part lying without it.

Moreover, the first lead member 6, the second lead member 7, and the third lead member 8 are made of a metal material such for example as copper, an iron-nickel-cobalt alloy, or an iron-nickel alloy. Each of the lead members can be produced by shaping an ingot of such a metal into a predetermined form by means of known metal working such as rolling, punching, or etching.

Moreover, the first lead member 6, the second lead member 7, and the third lead member 8 become capable of transmission of large-current signals at lower resistance so long as they are made of copper. Also in this case, since they are easily deformable, it is possible to suppress application of stress to the junction with the frame body 2, and thereby suppress occurrence of cracks or the like.

The thermal conductivity of each of the first lead member 6, the second lead member 7, and the third lead member 8 is adjusted to fall in the range of 10 (W/m•K) or more and 500 (W/m•K) or less, for example. Moreover, the thermal expansion coefficient of each of the first lead member 6, the second lead member 7, and the third lead member 8 is adjusted to fall in the range of 5 (ppm/° C.) or more and 20 (ppm/° C.) or less, for example.

The power semiconductor element 9 is mounted on the mounting portion 4b of the first mounting member 4. Where the power semiconductor element 9 has an electrode at its lower surface, the power semiconductor element 9 is electrically connected, via an electrically conducting bonding material, to the first mounting member 4. Thereby, electrical connection is established between the first lead member 6 and the power semiconductor element 9. The bonding material is made of gold-tin or gold-germanium, for example. Moreover, where the power semiconductor element 9 has an electrode at its upper surface, the power semiconductor element 9 is electrically connected to the first mounting member 4 by means of bonding wire or otherwise. The power semiconductor element 9 is also electrically connected to the second mounting member 5 and the third lead member 8 by means of bonding wire or otherwise.

The power semiconductor element 9, which features lower resistance, operation capability under high-temperature conditions, and high thermal conductivity, is capable of reduction in heat generation entailed by lessening of power losses, and is thus conducive to downsizing of an electric power converter. The power semiconductor element 9 finds a number of applications, including a low-loss power transmission system, a vehicle having a downsized inverter, an energy-saving household electrical appliance, a personal computer having a downsized AC adapter, and a solar power system capable of highly efficient power conversion.

The power semiconductor element 9 is constructed of, instead of a Si-based device material such as silicon, a GaN-based power device material such as gallium nitride or a SiC-based power device material such as silicon carbide. For example, the power semiconductor element 9 can be produced by sublimation technique, solution technique (flux technique), high-temperature CVD technique, or the like using such a power device material.

The lid body 10 is disposed on the upper surface of the frame body 2 to seal the power semiconductor element 9 hermetically. Moreover, the lid body 10 is rectangular-shaped, and is made of a metal material such for example as an iron-nickel-cobalt alloy or an iron-nickel alloy. Furthermore, the thermal expansion coefficient of the lid body 10 is adjusted to fall in the range of 5 (ppm/° C.) or more and 15 (ppm/° C.) or less, for example. In addition, for example, the lid body 10 is so configured that the width of one side falls in the range of 20 (mm) or more and 25 (mm) or less, the width of the other side falls in the range of 20 (mm) or more and 25 (mm) or less, and the thickness falls in the range of 0.2 (mm) or more and 1 (mm) or less.

The power semiconductor element 9 is fixedly bonded to the mounting portion 4b of the upper main surface of the first mounting member 4. An electrode disposed on the upper surface of the power semiconductor element 9 is electrically connected to the second mounting member 5 and the third lead member 8 by means of bonding wire or otherwise. Then, the lid body 7 is bonded to the upper surface of the frame body 2 so that the power semiconductor element 9 can be hermetically sealed in an interior area formed by the substrate 1, the frame body 2, and the lid body 7, thereby constituting a semiconductor device. That is, the semiconductor device is constructed by installing the power semiconductor element 9 and whereafter sealing it hermetically by the lid body 7.

Since the first mounting member 4 and the first lead member 6 are provided independently of each other, it follows that heat liberated by the power semiconductor element 9 is restrained from transmission to the first lead member 6 at the junction between the first mounting member 4 and the first lead member 6, wherefore thermal expansion of the first lead member 6 can be suppressed which thermal expansion results from the heat liberated by the power semiconductor element 9. Accordingly, in the semiconductor element housing package, occurrence of cracks and separation at the junction between the frame body 2 and the first lead member can be suppressed.

Figure 3:
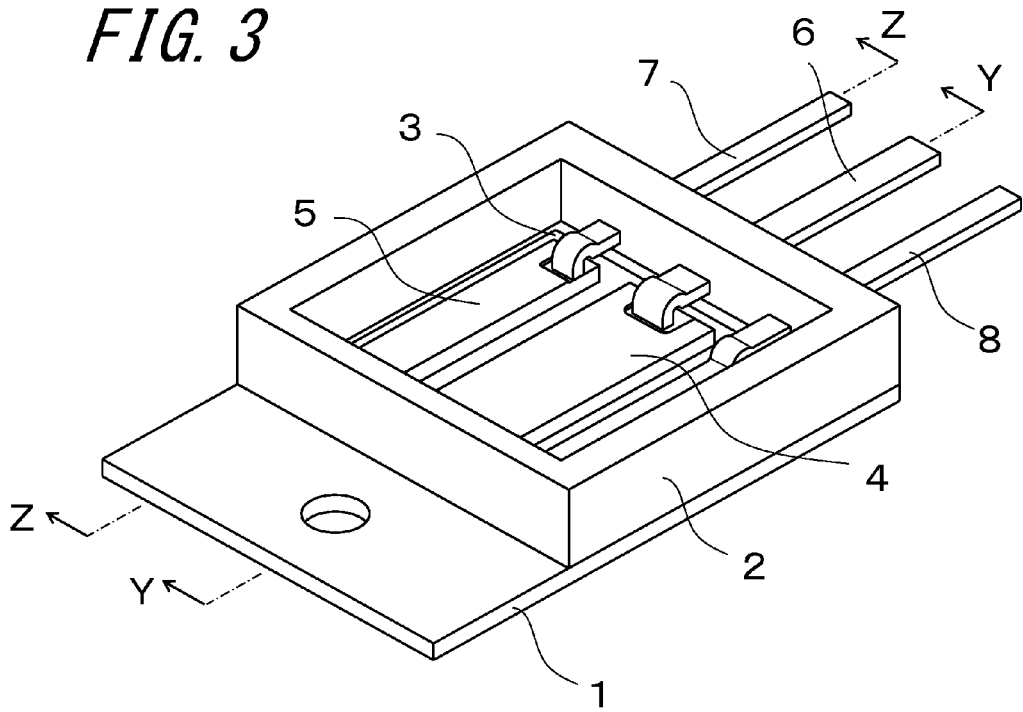
FIG. 3 is a perspective view of a semiconductor element housing package in accordance with one embodiment of the invention.
Figure 4:
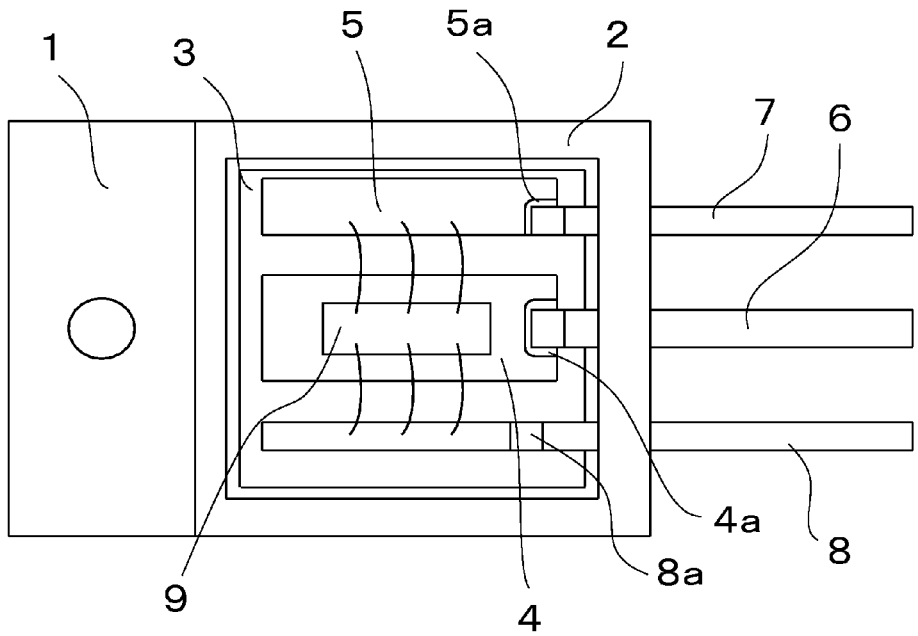
FIG. 4 is a plan view showing the semiconductor element housing package shown in FIG. 3, with a power semiconductor element provided therein.
Figure 5:
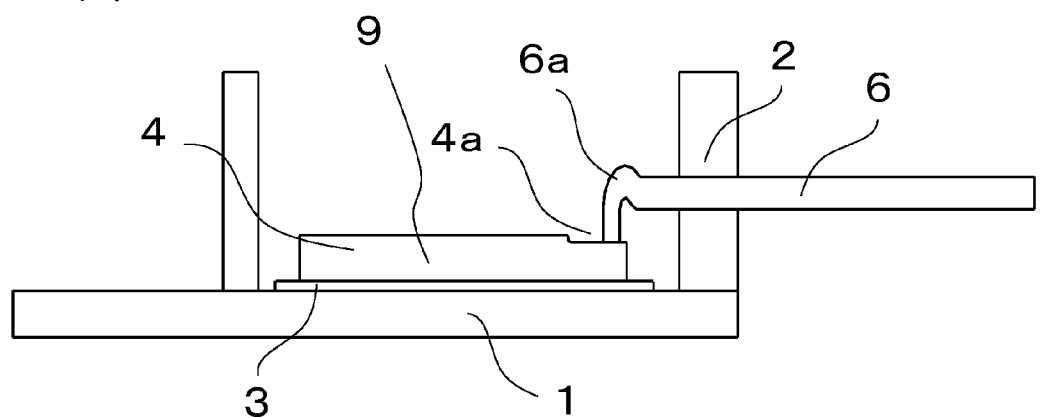
Figure 5:
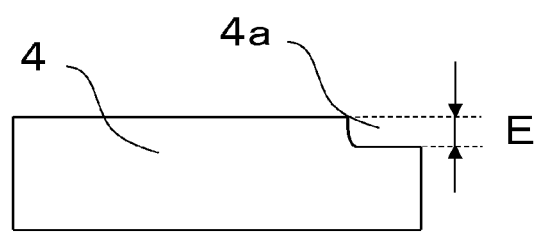
Figure 5:
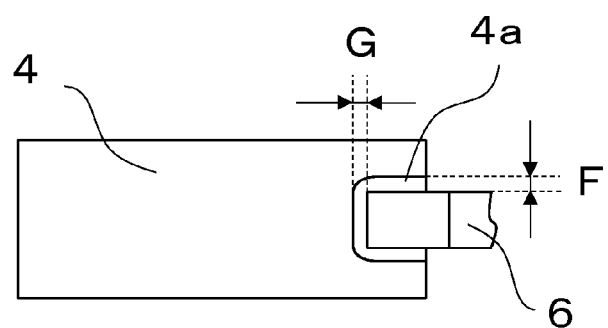
Figure 6:
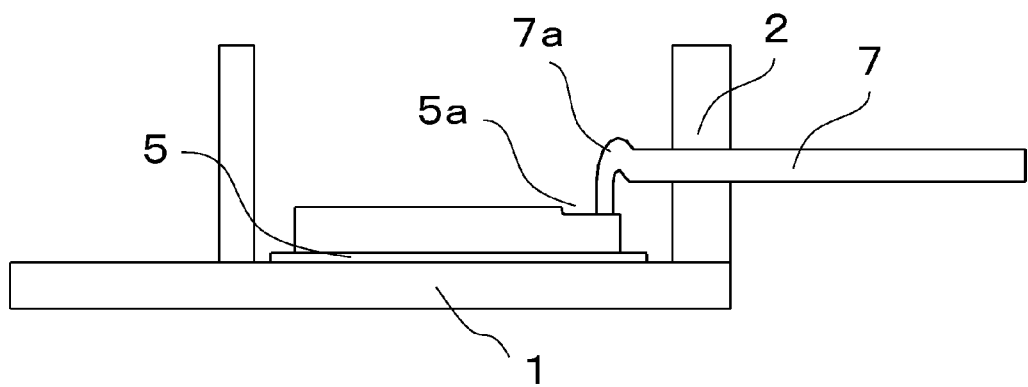
Figure 6:
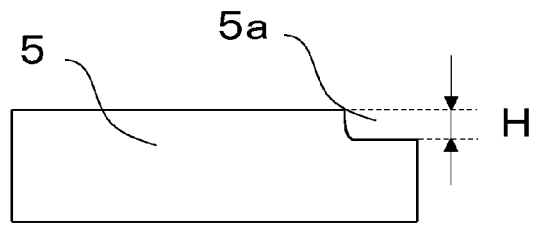
Figure 6:
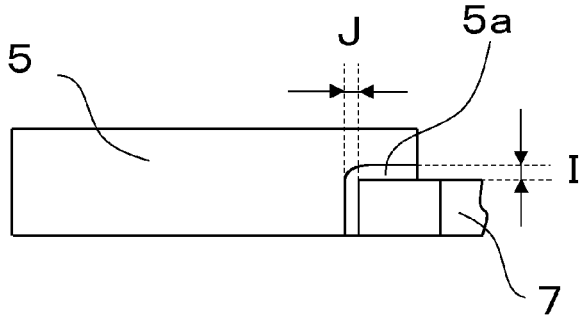

As shown in FIGS. 3 and 4, in the semiconductor element housing package, the first mounting member 4 has, at its junction with the first lead member 6, a first notch 4a formed by cutting the first mounting member 4 between the top and side regions, and, the first lead member 6 has a first bend 6a bent therefrom toward the notch 4a within the inside of the frame body 2. Note that the notch 4a is so shaped as to leave both sides of the first mounting member 4 intact. That is, the first lead member 6 has its one end electrically connected, via a bonding material, to the notch 4a. Note that the first bend 6a is obtained by bending the first lead member 6 in such a manner that a resultant bend has a convexity.

The first lead member 6 is so disposed as to pass through the frame body 2 from the exterior thereof and extend over the first mounting member 4 for connection therewith through the first bend 6a. Moreover, the second lead member 7 is so disposed as to pass through the frame body 2 from the exterior thereof and extend over the second mounting member 5 for connection therewith through a second bend 7a.

Moreover, since the first mounting member 4 has the notch 4a, wet spreading of the bonding material over the upper surface of the first mounting member 4 can be suppressed. This makes it possible to suppress leakage of electric current over irrelevant locations on the first mounting member 4 resulting from the wet spreading of the bonding material over the first mounting member 4, and thereby implement a semiconductor element housing package which excels in electrical characteristics. In the event of the wet spreading of the bonding material, there arise possibilities that the power semiconductor element 9 cannot be placed properly with respect to the first mounting member 4, wire bonding cannot be conducted as intended, and heat cannot be transmitted effectively from the power semiconductor element 9 to the first mounting member 4.

Moreover, at the time of joining the first mounting member 4 and the first lead member 6 together by the bonding material, the junction between them is subjected to heat with consequent thermal expansion, and subsequently, even if the first lead member 6 contracts following the joining, it is possible to abate the deformation resulting from the contraction by virtue of the first bend 6a, and thereby suppress application of stress caused by the contraction to the frame body 2.

Moreover, in order to suppress the wet spreading of the bonding material, a depth E of the notch 4a of the first mounting member 4 is adjusted to fall in the range of 0.05 (mm) or more and 0.5 (mm) or less, for example. Furthermore, in order to suppress the wet spreading of the bonding material, a spacing F between the notch 4a and the first lead member 6 is adjusted to fall in the range of 0.1 (mm) or more and 1 (mm) or less, for example, and, a spacing G between them is adjusted to fall in the range of 0.2 (mm) or more and 1 (mm) or less, for example.

Moreover, the second mounting member 5 has, at its junction with the second lead member 7, a second notch 5a formed by cutting the second mounting member 5 between the top and side regions. The second lead member 7 has a second bend 7a formed at its one end so as to be bent therefrom toward the notch 5a. That is, the second lead member 7 has its one end electrically connected, via a bonding material, to the notch 5a of the second mounting member 5. Furthermore, the other end of the second lead member 7 extends, through the first penetration portion 2b, outward beyond the frame body 2. The second lead member 7 has, at its part located above the notch 5a, the second bend 7a bent therefrom toward the notch 5a. Note that the second bend 7a is obtained by bending the second lead member 7 in such a manner that a resultant bend has a convexity.

Moreover, since the second mounting member 5 has the notch 5a, wet spreading of the bonding material over the upper surface of the second mounting member 5 can be suppressed. This makes it possible to suppress leakage of electric current over irrelevant locations on the second mounting member 5 resulting from the wet spreading of the bonding material over the second mounting member 5, and thereby implement a semiconductor element housing package which excels in electrical characteristics.

Moreover, at the time of joining the second mounting member 5 and the second lead member 7 together by the bonding material, the junction between them is subjected to heat with consequent thermal expansion, and subsequently, even if the second lead member 7 contracts following the joining, it is possible to abate the deformation resulting from the contraction by virtue of the second bend 7a, and thereby suppress application of stress caused by the contraction to the frame body 2.

Moreover, in order to suppress the wet spreading of the bonding material, a depth H of the notch 5a of the second mounting member 5 is adjusted to fall in the range of 0.05 (mm) or more and 0.5 (mm) or less, for example. Furthermore, in order to suppress the wet spreading of the bonding material, a spacing I between the notch 4a and the first lead member 6 is adjusted to fall in the range of 0.1 (mm) or more and 1 (mm) or less, for example, and, a spacing J between them is adjusted to fall in the range of 0.2 (mm) or more and 1 (mm) or less, for example.

Figure 7:
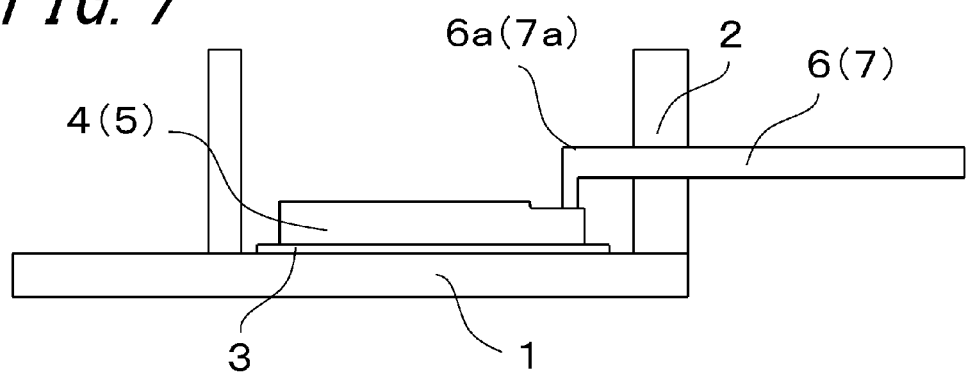
FIG. 7 is a sectional view showing a modified example of the first lead member and the second lead member.
Figure 8:
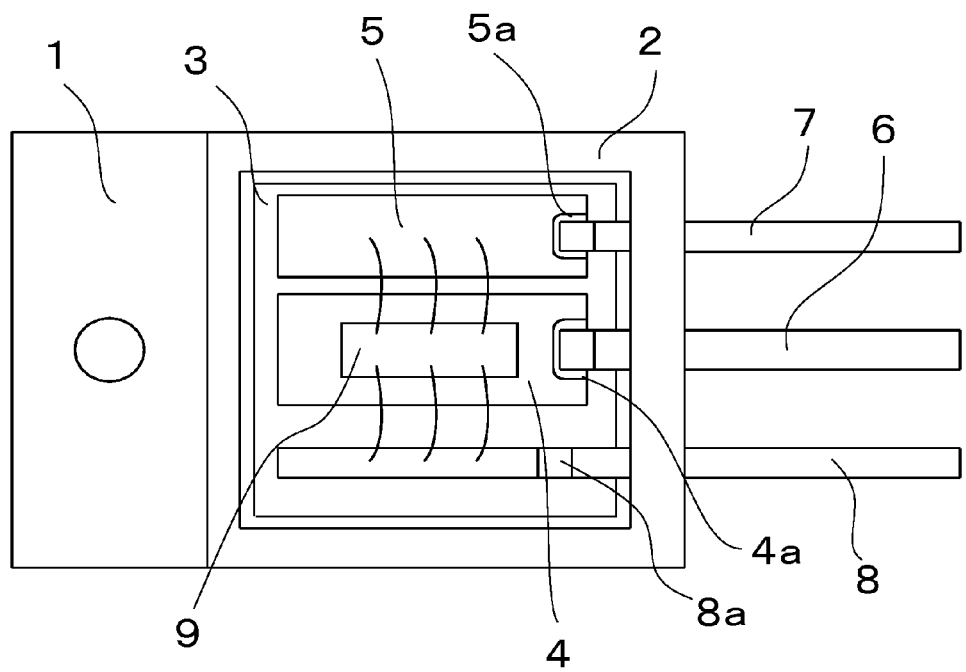
FIG. 8 is a plan view of a modified example 1 of the semiconductor element housing package, with a power semiconductor element mounted thereon.

Moreover, as shown in FIG. 7, the first bend 6a or the second bend 7a may be bent in rectangular form toward the notch 4a or the notch 5a. Furthermore, as shown in FIG. 8, the notch 5a of the second mounting member 5 may be similar in configuration to the notch 4a of the first mounting member 4.

The radius of curvature of the first bend 6a which corresponds to the bent part of the first lead member 6 is adjusted to fall in the range of 0.5 mm or more and 2 mm or less, for example. Moreover, the radius of curvature of the second bend 7a which corresponds to the bent part of the second lead member 7 is adjusted to fall in the range of 0.3 mm or more and 1.8 mm or less, for example. Thus, the bent part of the first lead member 6 is made larger in radius of curvature than the bent part of the second lead member 7. Since the power semiconductor element 9 is mounted on the first mounting member 4, it follows that the first lead member 6 is susceptible to application of thermal stress and is thus more prone to thermal deformation than is the second lead member 7. In this regard, by adjusting the radius of curvature of the first bend 6a to be larger than the radius of curvature of the second bend 7a, it is possible to achieve abatement of the thermal deformation of the first lead member 6 resulting from heat liberated by the power semiconductor element 9 mounted on the first mounting member 4.

Figure 9:
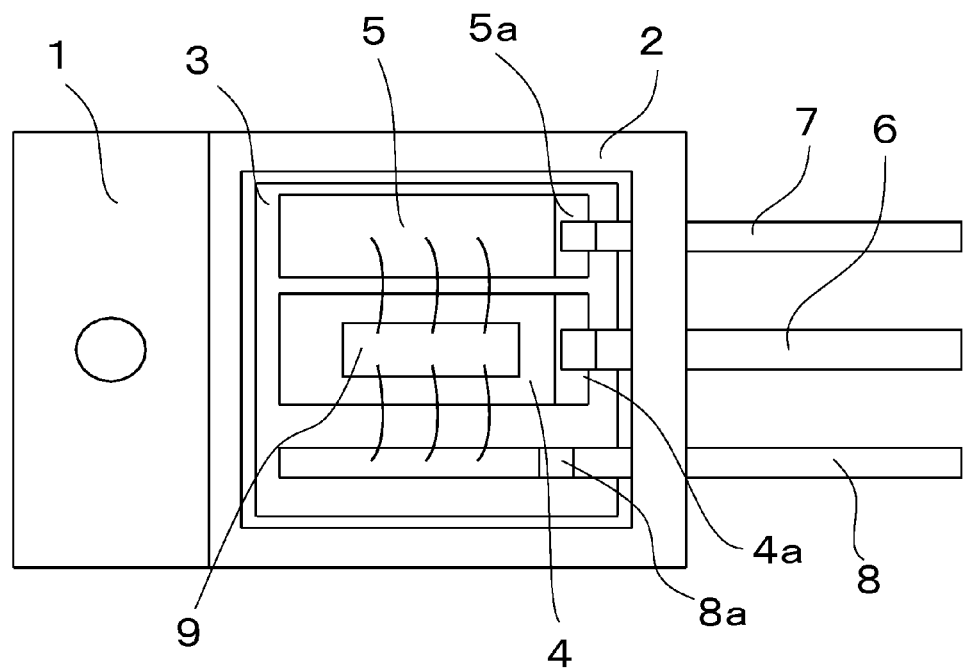
FIG. 9 is a plan view of a modified example 2 of the semiconductor element housing package, with a semiconductor element mounted thereon.

Moreover, in the semiconductor element housing package as shown in FIG. 9, the first notch 4a, as well as the second notch 5a, is so shaped as to extend over both sides of the first mounting member 4, as well as the second mounting member 5. In this case, in the first mounting member 4, as the part constituting the notch 4a is increased in area, the thickness of the notch 4a can be reduced correspondingly. Likewise, in the second mounting member 5, as the part constituting the notch 5a is increased in area, the thickness of the notch 5a can be reduced correspondingly. Thus, thermal stress can be lessened in regions immediately below both of the notches, wherefore occurrence of cracks and separation in the substrate 1 or the insulating substrate 3 can be suppressed.

Moreover, with the provision of the first notch 4a and the second notch 5a, the first mounting member 4 and the second mounting member 5 can be made smaller, and it is thus less likely that the thermal stress caused by heat liberated by the power semiconductor element 9 due to the difference in thermal expansion coefficient between the constituent components will be exerted significantly on the components, wherefore it is possible to suppress separation of the first lead member 6 from the first mounting member 4 and separation of the second lead member 7 from the second mounting member 5.

It should be understood that the application of the invention is not limited to the embodiment as described heretofore, and that various changes, modifications, and improvements are possible without departing from the scope of the invention.

<Method for Manufacturing Semiconductor Element Housing Package and Semiconductor Device>

Now, a method for manufacturing a semiconductor element housing package and a semiconductor device equipped with the semiconductor element housing package will be described. The substrate 1 is formed by, for example, shaping an ingot made of a copper-tungsten alloy cast in a mold into a predetermined configuration by known metal working such as cutting or punching.

In forming the frame body 2, where it is made for example of aluminum oxide sintered body, an organic binder, a plasticizer, a solvent, a dispersant, and so forth are admixed in powder of raw materials including aluminum oxide, silicon oxide, magnesium oxide, calcium oxide and the like thereby to prepare a paste, and the paste is molded into green sheets by means of a doctor blade method, a calendar roll method, or otherwise.

Then, the flat green sheet is given a predetermined shape by punching operation using a die. By stacking a plurality of such green sheets on top of each other, a form of the frame body 2 can be obtained. Moreover, the frame body 2 has metallization layers formed in the locations corresponding to the junction with the substrate 1, the junction with the lid body 10, the junction with the first lead member 6, the junction with the second lead member 7, and the junction with the third lead member 8, respectively. The frame body 2 can be produced by firing the form of the frame body 2 at a temperature of about 1600° C.

Moreover, in forming the insulating substrate 3, green sheets are prepared just as in the case of forming the frame body 2. The insulating substrate 3 having a predetermined shape can be produced by firing those sheets. Note that the insulating substrate 3 has metallization layers formed in the locations on the upper surface thereof that correspond to the junction with the first mounting member 4, the junction with the second mounting member 5, and the junction with the third lead member 8, respectively, and also in the location on the lower surface thereof that corresponds to the substrate 1. The frame body 2 is bonded to the upper main surface of the substrate 1 via a bonding material. Then, the insulating substrate 3 is bonded onto a region of the substrate via a bonding material, the region being surrounded with the frame body 2.

The first mounting member 4 and the second mounting member 5 are each formed by, for example, shaping an ingot made of copper cast in a mold into a predetermined configuration by known metal working such as cutting or punching. The first mounting member 4 and the second mounting member 5 are bonded onto the insulating substrate 3 via a bonding material.

The first lead member 6, the second lead member 7, and the third lead member 8 are each formed by, for example, shaping an ingot made of copper and an iron-nickel-cobalt alloy cast in a mold into a predetermined configuration by known metal working such as cutting, punching, or press-working. One ends of the first lead member 6, the second lead member 7, and the third lead member 8 are bonded to the first mounting member 4, the second mounting member 5, and the insulating substrate 3, respectively, via a brazing filler metal such as silver solder or a brazing silver-copper alloy.

Now, a method for manufacturing a semiconductor device will be described. The semiconductor device includes the semiconductor element housing package, the power semiconductor element 9, and the lid body 10. The lid body 10 is formed by, for example, shaping an ingot made of an iron-nickel-cobalt alloy cast in a mold into a predetermined configuration by known metal working such as cutting or punching. The power semiconductor element 9 is fixedly bonded to the mounting portion 4b of the first mounting member 4 for electrical connection with the first lead member 6. The power semiconductor element 9 is electrically connected to the second mounting member 5 and the third lead member 8 by means of bonding wire or otherwise. Then, the lid body 10 is disposed on the upper surface of the frame body 2. That is, in the semiconductor device, the power semiconductor element 9 is hermetically sealed by the lid body 10.

What is claimed is:

1. A semiconductor element housing package, comprising:
   a substrate;
   a frame body disposed on the substrate;
   an insulating substrate disposed in a region of the substrate, the region being surrounded with the frame body;
   a first mounting member disposed on the insulating substrate, for mounting a power semiconductor element thereon;
   a second mounting member disposed on the insulating substrate being spaced away from the first mounting member;
   a first lead member passing through the frame body from an exterior thereof, comprising a first bend and making connection with the first mounting member through the first bend; and
   a second lead member passing through the frame body from the exterior thereof, comprising a second bend and making connection with the second mounting member through the second bend.

2. The semiconductor element housing package according to claim 1,
   wherein the first mounting member and the second mounting member are configured to be a rectangular plate-like body, and
   the first lead member extends in a longitudinal direction of the first mounting member, and the second lead member extends in a longitudinal direction of the second mounting member.

3. The semiconductor element housing package according to claim 2,
   wherein the longitudinal direction of the first mounting member and the longitudinal direction of the second mounting member coincide with each other, and
   a width of the first mounting member in a direction perpendicular to the longitudinal direction as seen in a plan view is greater than a width of the second mounting member in a direction perpendicular to the longitudinal direction as seen in a plan view.

4. The semiconductor element housing package according to claim 1,
   wherein a junction between the first mounting member and the first lead member is defined by a notch extending in a range from a top surface of the first mounting member to a side surface of the first mounting member.

5. The semiconductor element housing package according to claim 4,
   wherein a junction between the second mounting member and the second lead member is defined by a notch extending in a range from a top surface of the second mounting member to a side surface of the second mounting member.

6. The semiconductor element housing package according to claim 4,
   wherein the first lead member comprises a one end portion in the region of the substrate, the one end portion connected via a bonding material to the notch of the first mounting member.

7. The semiconductor element housing package according to claim 4,
   Wherein a depth of the notch of the first mounting member is 0.05 (mm) or more and 0.5 (mm) or less.

8. The semiconductor element housing package according to claim 1,
   wherein a junction between the second mounting member and the second lead member is defined by a notch extending in a range from a top surface of the second mounting member to a side surface of the second mounting member.

9. The semiconductor element housing package according to claim 1,
   wherein surfaces of the first mounting member and the second mounting member are made of an electrically conducting material, respectively.

10. The semiconductor element housing package according to claim 1,
    wherein a radius of curvature of the first bend of the first lead member is greater than a radius of curvature of the second bend of the second lead member.

11. A semiconductor device, comprising:
    the semiconductor element housing package according to claim 1;
    a power semiconductor element disposed on the first mounting member and electrically connected to the second mounting member via wire; and
    a lid body disposed on the frame body covering the power semiconductor element.

12. A semiconductor element housing package comprising:
    a substrate made of a metal material;
    a ceramic frame body disposed on the substrate;
    an insulating substrate made of a ceramic material, disposed in a region of the substrate, the region being surrounded with the ceramic frame body;
    a first mounting member disposed on the insulating substrate, for mounting a power semiconductor element thereon;
    a second mounting member disposed on the insulating substrate being spaced away from the first mounting member;
    a first lead member passing through the ceramic frame body from an exterior thereof and disposed on the first mounting member; and
    a second lead member disposed so as to pass through the ceramic frame body from the exterior thereof and disposed on the second mounting member.

* * * * *